(12) United States Patent
Ito

(10) Patent No.: US 10,855,245 B2
(45) Date of Patent: Dec. 1, 2020

(54) SWITCH COMPONENT, HIGH-FREQUENCY MODULE, AND COMMUNICATION APPARATUS

(71) Applicant: Murata Manufacturing Co., Ltd., Nagaokakyo (JP)

(72) Inventor: Takanori Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/180,056

(22) Filed: Nov. 5, 2018

(65) Prior Publication Data

US 2019/0074810 A1  Mar. 7, 2019

Related U.S. Application Data

(63) Continuation of application No. PCT/JP2017/014159, filed on Apr. 4, 2017.

(30) Foreign Application Priority Data

May 17, 2016  (JP) .................................. 2016-099036

(51) Int. Cl.
   *H03H 7/38*    (2006.01)
   *H04B 1/403*   (2015.01)
   (Continued)

(52) U.S. Cl.
   CPC ............ *H03H 7/38* (2013.01); *H03H 7/0161* (2013.01); *H03H 7/175* (2013.01); *H03K 17/687* (2013.01); *H03K 17/74* (2013.01); *H04B 1/0458* (2013.01); *H04B 1/18* (2013.01); *H04B 1/403* (2013.01); *H03H 2007/013* (2013.01); *H03H 2007/386* (2013.01)

(58) Field of Classification Search
   CPC ........ H03H 7/38; H03H 7/0161; H03H 7/175; H03H 2007/013; H03H 2007/386; H03K 17/687; H03K 17/74
   See application file for complete search history.

(56) References Cited

U.S. PATENT DOCUMENTS

| | | | | |
|---|---|---|---|---|
| 5,809,405 A | * | 9/1998 | Yamaura | ................. H04B 1/406 455/101 |
| 5,872,489 A | * | 2/1999 | Chang | ................. H01L 27/0611 257/531 |

(Continued)

FOREIGN PATENT DOCUMENTS

| | | |
|---|---|---|
| JP | 10-93471 A | 4/1998 |
| JP | 2005-020140 A | 1/2005 |

(Continued)

OTHER PUBLICATIONS

Official Communication issued in International Patent Application No. PCT/JP2017/014159, dated Jun. 27, 2017.

*Primary Examiner* — Robert J Pascal
*Assistant Examiner* — Kimberly E Glenn
(74) *Attorney, Agent, or Firm* — Keating & Bennett, LLP

(57) ABSTRACT

A switch component includes a common terminal, at least two selection terminals, a switching circuit that selectively connects the common terminal to each of the at least two selection terminals, and an inductor. One end of the inductor is connected to one of the at least two selection terminals. The switching circuit is integrated with the inductor.

20 Claims, 8 Drawing Sheets

(51) Int. Cl.
*H04B 1/18* (2006.01)
*H04B 1/04* (2006.01)
*H03H 7/01* (2006.01)
*H03K 17/687* (2006.01)
*H03K 17/74* (2006.01)

(56) References Cited

U.S. PATENT DOCUMENTS

| | | | |
|---|---|---|---|
| 2008/0238567 A1* | 10/2008 | Rosetti | H03H 7/46 333/17.3 |
| 2012/0056795 A1* | 3/2012 | Nagumo | H01P 5/02 343/787 |
| 2013/0178180 A1 | 7/2013 | Oshima et al. | |
| 2014/0167877 A1* | 6/2014 | Shimizu | H03H 7/38 333/101 |
| 2014/0346635 A1 | 11/2014 | Kawahara et al. | |

FOREIGN PATENT DOCUMENTS

| | | |
|---|---|---|
| JP | 2006-109084 A | 4/2006 |
| JP | 2013-106128 A | 5/2013 |
| JP | 2014-230138 A | 12/2014 |
| JP | 2015-164202 A | 9/2015 |

* cited by examiner

SWITCH COMPONENT, HIGH-FREQUENCY MODULE, AND COMMUNICATION APPARATUS

CROSS REFERENCE TO RELATED APPLICATIONS

This application claims the benefit of priority to Japanese Patent Application No. 2016-099036 filed on May 17, 2016 and is a Continuation Application of PCT Application No. PCT/JP2017/014159 filed on Apr. 4, 2017. The entire contents of each application are hereby incorporated herein by reference.

BACKGROUND OF THE INVENTION

1. Field of the Invention

The present invention relates to a switch component, a high-frequency module, and a communication apparatus.

2. Description of the Related Art

Multiband-multimode mobile terminals that support multiple frequency bands and multiple radio systems using one terminal have been required in recent years. In order to meet the above requirement, high-frequency modules including high-frequency switches that appropriately select frequency bands for communication have been proposed. Japanese Unexamined Patent Application Publication No. 2013-106128 describes a technology relating to such high-frequency modules.

The high-frequency modules are required to further reduce their sizes in conjunction with multiband-multimode cellular phones in recent years. However, with the high-frequency module described in Japanese Unexamined Patent Application Publication No. 2013-106128, it is difficult to reduce the size of the high-frequency module while achieving the multiband function and the multimode function.

SUMMARY OF THE INVENTION

Preferred embodiments of the present invention provide switch components each capable of reducing the size of a high-frequency module, high-frequency modules, and communication apparatuses.

A switch component according to a preferred embodiment of the present invention includes a common terminal; at least two selection terminals; a switching circuit that selectively connects the common terminal to each of the at least two selection terminals; and an inductor. One end of the inductor is connected to one of the at least two selection terminals. The switching circuit is integrated with the inductor.

With this configuration, the inductor mounted in a space different from the space in which the switch component is mounted in a high-frequency module made of, for example, a low temperature co-fired ceramics (LTCC) substrate is integrated with the switching circuit. The integration of the inductor with the switching circuit means that the inductor is built in the switching circuit (for example, a semiconductor substrate) or is disposed on the switching circuit to be integrated with the switching circuit with resin mold or other suitable material. For example, an impedance matching circuit, a resonant circuit, or a filter including the inductor affects signals propagated on a signal path connecting an element (for example, an antenna element) connected to the common terminal side to an element (for example, a filter) connected to the selection terminal side when the common terminal is connected to the selection terminal to which one end of the inductor is connected. A coupler including the inductor is capable of measuring the strengths of the signals propagated on the signal path. As described above, since integrating the inductor useful for the high-frequency module with the switching circuit reduces the space in which the inductor is mounted in the high-frequency module, it is possible to reduce the size of the high-frequency module. In addition, since other components may be mounted in the high-frequency module, for example, in the mounting space that is reduced by integrating the inductor with the switching circuit, it is possible to, for example, add a filter or improve the radiation of heat generated by the filter.

In a switch component according to a preferred embodiment of the present invention, the inductor may be built in the switching circuit.

With this configuration, building the inductor in the switching circuit enables the size of the high-frequency module to be reduced in the height direction, as compared to a case in which, for example, the inductor is disposed on the switching circuit. In addition, since the inductor is built in the switching circuit, it is possible to protect the inductor.

In a switch component according to a preferred embodiment of the present invention, the other end of the inductor may be connected to a selection terminal different from the one selection terminal, among the at least two selection terminals.

With this configuration, for example, the influence on the signals propagated on the signal path when the common terminal is connected to the selection terminal to which one end of the inductor is connected is capable of being differentiated from that when the common terminal is connected to the selection terminal to which the other end of the inductor is connected. For example, the influence of the circuit including the inductor may be exerted on the signals when the common terminal is connected to the selection terminal to which one end of the inductor is connected and the influence of the circuit including the inductor may not be exerted on the signals when the common terminal is connected to the selection terminal to which the other end of the inductor is connected.

In a switch component according to a preferred embodiment of the present invention, the other end of the inductor may be grounded.

With this configuration, since the circuit including the inductor defines and functions as the impedance matching circuit and impedance matching between the switch component and the element connected to the selection terminal side is achieved, it is possible to reduce or prevent any loss (return loss) occurring on the signals propagated on the signal path.

In a switch component according to a preferred embodiment of the present invention, a capacitor may be connected in parallel to the inductor.

With this configuration, when the other end of the inductor is not grounded, the circuit including the inductor defines and functions as a parallel resonant circuit, which defines and functions as a band elimination filter capable of reducing or preventing any noise in the signals propagated on the signal path, for example, noise such as a harmonic component. For example, it is possible to improve the attenuation characteristics of the filter, which is an element connected to the selection terminal side. In contrast, when the other end of the inductor is grounded, the circuit including the inductor defines and functions as a band pass filter and any noise, such as a harmonic component, is capable of being reduced or prevented to transmit signals having desired frequency characteristics.

In a switch component according to a preferred embodiment of the present invention, one end of a capacitor may be connected to the other end of the inductor.

With this configuration, the circuit including the inductor defines and functions as a series resonant circuit, which defines and functions as a band pass filter capable of reducing or preventing any noise, such as a harmonic component, and transmitting signals having desired frequency characteristics. In addition, it is possible to reduce or prevent any noise, such as a harmonic component, for example, which is superposed on the signals and which is caused by the switch component.

In a switch component according to a preferred embodiment of the present invention, the other end of the capacitor may be grounded.

With this configuration, the circuit including the inductor defines and functions as a band elimination filter and it is possible to reduce or prevent any noise, such as a harmonic component.

In a switch component according to a preferred embodiment of the present invention, the inductor may be coupled to a signal path between the common terminal connected with the switching circuit and one selection terminal, among the at least two selection terminals.

With this configuration, the circuit including the inductor is capable of defining and functioning as a coupler, and the strengths of the signals propagated on the signal path to which the inductor is coupled are capable of being measured. Accordingly, integrating the inductor defining and functioning as the coupler capable of measuring the strengths of the signals with the switching circuit enables the high-frequency module to be reduced in size.

A high-frequency module according to a preferred embodiment of the present invention includes the switch component and a filter connected to at least one of the at least two selection terminals.

With this configuration, since integrating the inductor with the switching circuit reduces the space in which the inductor is mounted in the high-frequency module, it is possible to reduce the size of the high-frequency module.

A communication apparatus according to a preferred embodiment of the present invention includes the high-frequency module and a controller that controls the switching circuit.

With this configuration, since integrating the inductor with the switching circuit reduces the space in which the inductor is mounted in the high-frequency module, it is possible to reduce the size of the high-frequency module.

With the switch components, the high-frequency modules, and the communication apparatuses according to preferred embodiments of the present invention, it is possible to reduce the size of the high-frequency modules.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
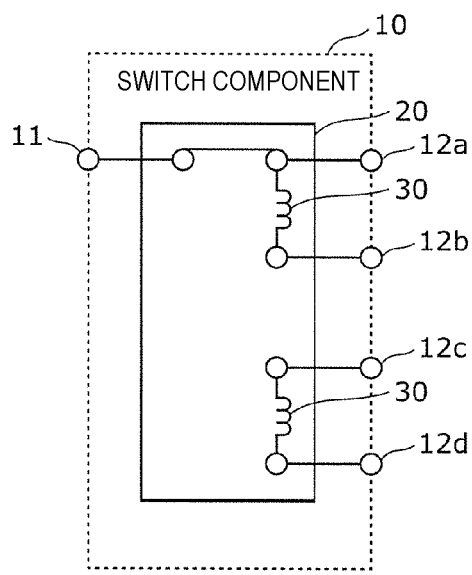
FIG. 1A is a configuration diagram illustrating an example of a switch component according to a first preferred embodiment of the present invention.

Preferred embodiments of the present invention will be described in detail with reference to the drawings. The preferred embodiments described below indicate comprehensive or specific examples. Numerical values, shapes, materials, components, the arrangement of the components, the connection mode of the components, and other features and characteristics, which are indicated in the preferred embodiments described below, are only examples and are not intended to limit the present invention. Among the components in the preferred embodiments described below, the components that are not described in the independent claims are described as optional components. In addition, the sizes or the ratios of the sizes of the components illustrated in the drawings are not necessarily strictly indicated.

First Preferred Embodiment

First, the configuration of a switch component 10 according to a first preferred embodiment of the present invention will now be described with reference to FIGS. 1A to 1C.

FIG. 1A is a configuration diagram illustrating an example of the switch component 10 according to the first preferred embodiment.

The switch component 10 includes a common terminal 11, selection terminals 12a to 12d, and a switching circuit 20. It is sufficient for the switch component 10 to be provided with at least two selection terminals. For example, the switch component 10 may be provided with only two selection terminals or may be provided with three or five or more selection terminals.

The switching circuit 20 selectively connects the common terminal 11 to each of the at least two selection terminals (the selection terminals 12a to 12d here). For example, the switching circuit 20 preferably includes a switch including a semiconductor, such as a PIN diode or a metal semiconductor field effect transistor (MESFET). The switching circuit 20 selectively connects the common terminal 11 to each of the at least two selection terminals, for example, in response to a control signal that is externally supplied.

For example, an antenna element is connected to the common terminal 11. For example, filters (for example, duplexers) having different pass frequency bands are connected to the selection terminals 12a to 12d. The switching circuit 20 selectively connects the common terminal 11 to any of the selection terminals 12a to 12d to appropriately select the frequency band for communication. Although the switching circuit 20 is capable of selectively connecting the common terminal 11 to any of the selection terminals 12a to 12d, a state in which the common terminal 11 is connected to the selection terminal 12a is illustrated in FIG. 1A as an example. Although the state in which the common terminal 11 is connected to the selection terminal 12a is illustrated in FIGS. 2 to 8A described below, the state in all of the drawings is only an example. The common terminal 11 may be connected to another selection terminal. The connection mode of elements connected to the selection terminals 12a and 12b is described as being the same as the connection mode of elements connected to the selection terminals 12c and 12d in FIGS. 2 to 8A described below. Accordingly, a description of the connection mode of elements connected to the selection terminals 12c and 12d is omitted herein. However, the characteristics of the elements around the selection terminals 12a and 12b may be different from the characteristics of the elements around the selection terminals 12c and 12d. For example, a filter including a pass frequency band different from that of the selection terminals 12a and 12b, an inductor having an inductance different from that of the selection terminals 12a and 12b, or a capacitor having an electrostatic capacitance different from that of the selection terminals 12a and 12b may be connected to the selection terminals 12c and 12d.

The switch component 10 includes inductors 30. Each of the inductors 30 preferably define, for example, an impedance matching circuit, a resonant circuit, a filter, or a coupler. The circuit including the inductors 30 will be described in detail below.

One end of the inductor 30 is connected to one selection terminal 12a, among the at least two selection terminals (the selection terminals 12a and 12b). The other end of the inductor 30 is connected to the selection terminal 12b different from the selection terminal 12a, among the at least two selection terminals. Here, the switching circuit 20 is integrated with the inductors 30. Specifically, the inductor 30 is built in the switching circuit 20. The switch component 10 including the inductor 30 built in the switching circuit 20 will now be described with reference to FIGS. 1B and 1C.

Figure 1B:
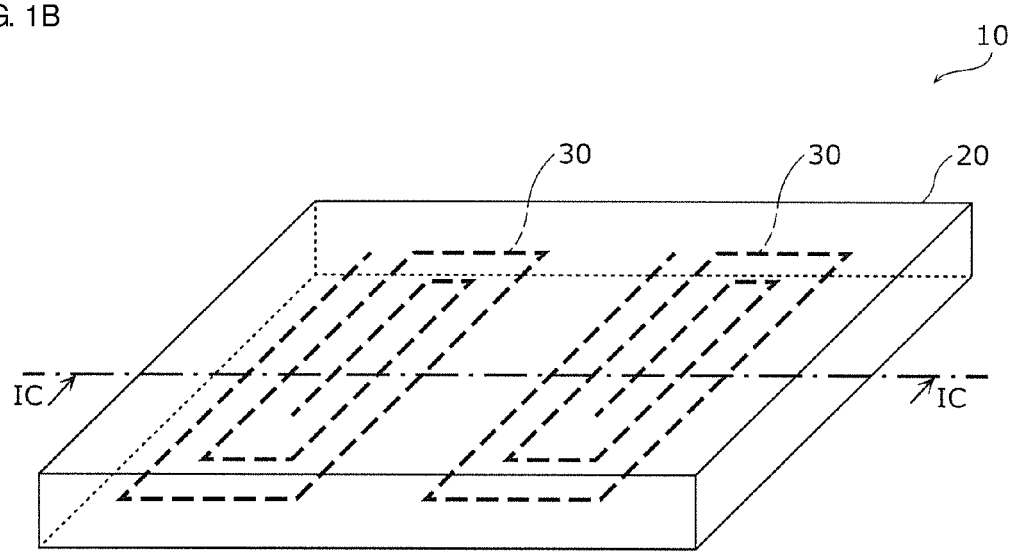
FIG. 1B is a schematic external view illustrating an example of the switch component according to the first preferred embodiment of the present invention.

FIG. 1B is a schematic external view illustrating an example of the switch component 10 according to the first preferred embodiment.

Figure 1C:
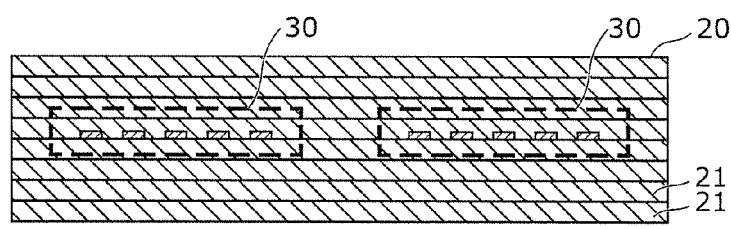
FIG. 1C is a schematic cross-sectional view of a switching circuit, taken along an IC-IC line illustrated in FIG. 1B.

FIG. 1C is a schematic cross-sectional view of the switching circuit 20, taken along an IC-IC line illustrated in FIG. 1B. A leading conductor of the inductor 30, the common terminal 11, and the selection terminals 12a to 12d are not illustrated in FIGS. 1B and 1C.

The switching circuit 20 is preferably, for example, a semiconductor substrate in which a plurality of base layers 21 are laminated. The switching circuit 20 preferably includes a switch including a semiconductor, such as a PIN diode or a MESFET. In addition, providing the base layer 21 on which patterns made of metal or an alloy, for example, including silver as a main component are printed or etched in a central portion of the plurality of laminated base layers 21 in the laminated direction, as illustrated in FIG. 1C, defines the switching circuit 20 including the built-in inductors 30. The shape of each of the inductors 30 is not limited to the pattern that is, for example, printed on one base layer 21, illustrated in FIGS. 1B and 1C. For example, the inductor 30 may have a spiral shape in which patterns that are, for example, printed on the plurality of base layers 21 are connected to each other with interlayer conductors (via conductors).

As described above, since integrating the inductor 30 with the switching circuit 20 (for example, the inductor 30 is built in the switching circuit 20) reduces the space in which the inductor 30 is mounted in the high-frequency module, it is possible to reduce the size of the high-frequency module.

Next, the configuration of a communication apparatus 200 will now be described with reference to FIG. 2.

Figure 2:
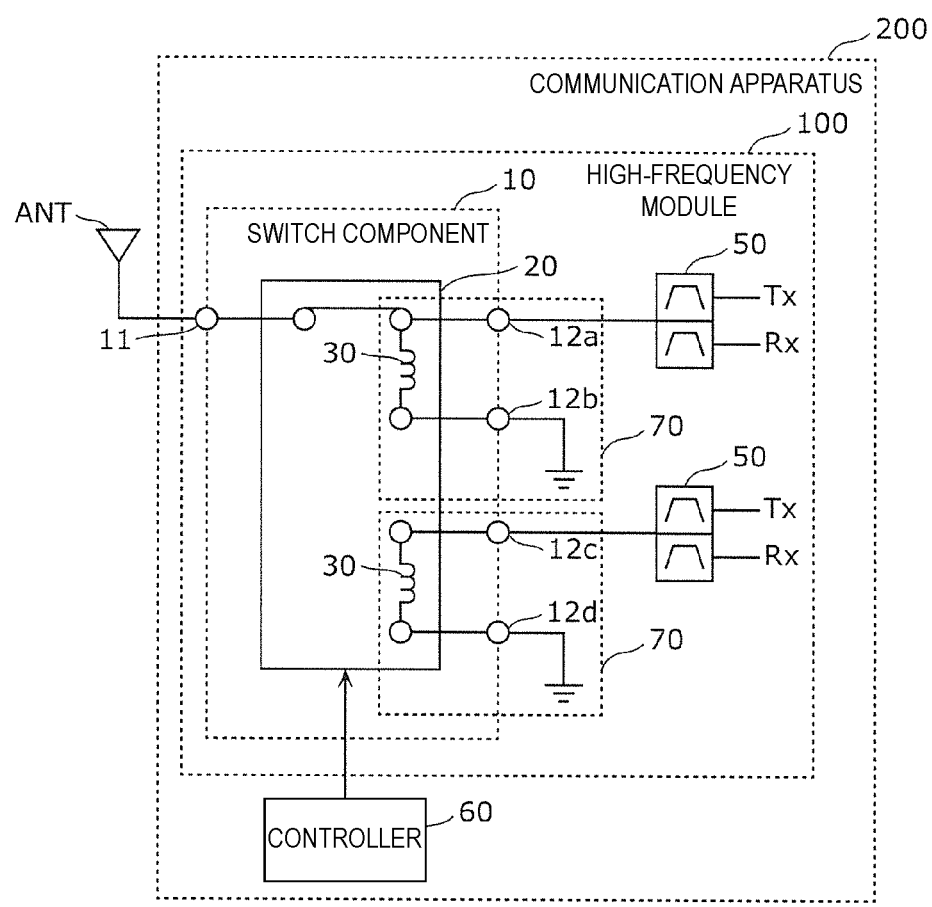
FIG. 2 is a configuration diagram illustrating an example of a communication apparatus according to the first preferred embodiment of the present invention.

FIG. 2 is a configuration diagram illustrating an example of the communication apparatus 200 according to the first preferred embodiment. An antenna element ANT is also illustrated in FIG. 2. The communication apparatus 200 is provided in a multimode-multiband mobile terminal and receives and transmits signals via the antenna element ANT.

The communication apparatus 200 includes a high-frequency module 100 and a controller 60.

The high-frequency module 100 includes the switch component 10 and filters 50. The high-frequency module 100 includes, for example, an LTCC substrate on which the switch component 10 and the filters 50 are mounted. The high-frequency module 100 is disposed in, for example, a front-end unit in the mobile terminal.

Each of the filters 50 has bandpass characteristics for propagating high-frequency signals in a certain frequency band. In the present preferred embodiment, the filter 50 is, for example, a duplexer and switches between a transmission path (Tx) and a reception path (RX) while using one antenna element ANT in communication using a frequency division duplex (FDD) method. In other words, the filter 50 separates (demultiplexes) an input signal into a transmission signal and a reception signal. The high-frequency signals transmitted through the filter 50 connected to the selection terminal 12a in FIG. 2 are in a frequency band different from that of the high-frequency signals transmitted through the filter 50 connected to the selection terminal 12c in FIG. 2. The filter 50 connected to the selection terminal 12a transmits signals in a first pass band and the filter 50 connected to the selection terminal 12c transmits signals in a second pass band lower than the first pass band.

The controller 60 is preferably, for example, a radio frequency integrated circuit (RFIC) that performs signal processing of the high-frequency signals and controls the switching circuit 20 to selectively connect the common terminal 11 to each of the at least two selection terminals. Although the controller 60 is preferably, for example, a processor or other device that executes a control program stored in a storage unit (not illustrated) in the communication apparatus 200, the controller 60 may be a microcomputer, a dedicated circuit, or other suitable device.

The high-frequency module 100 selectively transmits the high-frequency signals in a certain frequency band corresponding to the bandpass characteristics of the filter 50 connected to the selection terminal through the selective connection of the common terminal 11 to any of the selection terminals 12a to 12d in the switch component 10. For example, when the common terminal 11 is connected to the selection terminal 12a, the frequency band of the communication signals is the pass frequency band of the upper-side filter 50 in FIG. 2. Similarly, when the common terminal 11 is connected to the selection terminal 12c, the frequency band of the communication signals is the pass frequency band of the lower-side filter 50 in FIG. 2. As described above, the high-frequency module 100 includes the multiple switchable signal paths to transmit and receive the signals in the multiple frequency bands in order to support, for example, the multimode function and the multiband function.

In the high-frequency module 100, grounding the other end of the inductor 30 (for example, grounding the selection terminal 12b) causes the inductor 30 to define an impedance matching shunt inductor. Accordingly, each inductor 30 defines an impedance matching circuit 70. With this configuration, impedance matching between the switch component 10 and the filter 50 connected to, for example, the selection terminal 12a is achieved and, when the common terminal 11 is connected to the selection terminal 12a, it is possible to reduce or prevent any loss occurring in the signals propagated on the signal path connecting the antenna element ANT to the filter 50 connected to the selection terminal 12a. Accordingly, integrating the inductor 30 defining the impedance matching circuit 70 with the switching circuit 20 enables the high-frequency module 100 to be reduced in size.

Each end of the inductor 30 may not be connected to the selection terminal. For example, one end of the inductor 30 may be connected to the selection terminal 12a and the other end thereof may not be connected to another selection terminal. In this case, the other end of the inductor 30 is connected to a terminal or other structure that is not selectively switched with the switching circuit 20. For example, the terminals illustrated as the selection terminals 12b and 12d in FIG. 2 may not be the selection terminals. In other words, the terminals illustrated as the selection terminals 12b and 12d may not be terminals connectable to the common terminal 11.

In addition, the connection mode of elements around each selection terminal illustrated in FIG. 2 is only an example. For example, the filter 50 may be connected to the selection terminal 12b and the selection terminal 12a may be grounded. In this case, when the common terminal 11 is connected to the selection terminal 12b, it is possible to reduce or prevent any loss occurring in the signals propagated on the signal path connecting the antenna element ANT to the filter 50 connected to the selection terminal 12b.

Second Preferred Embodiment

The configuration of a communication apparatus 200a according to a second preferred embodiment of the present invention will now be described with reference to FIG. 3.

Figure 3:
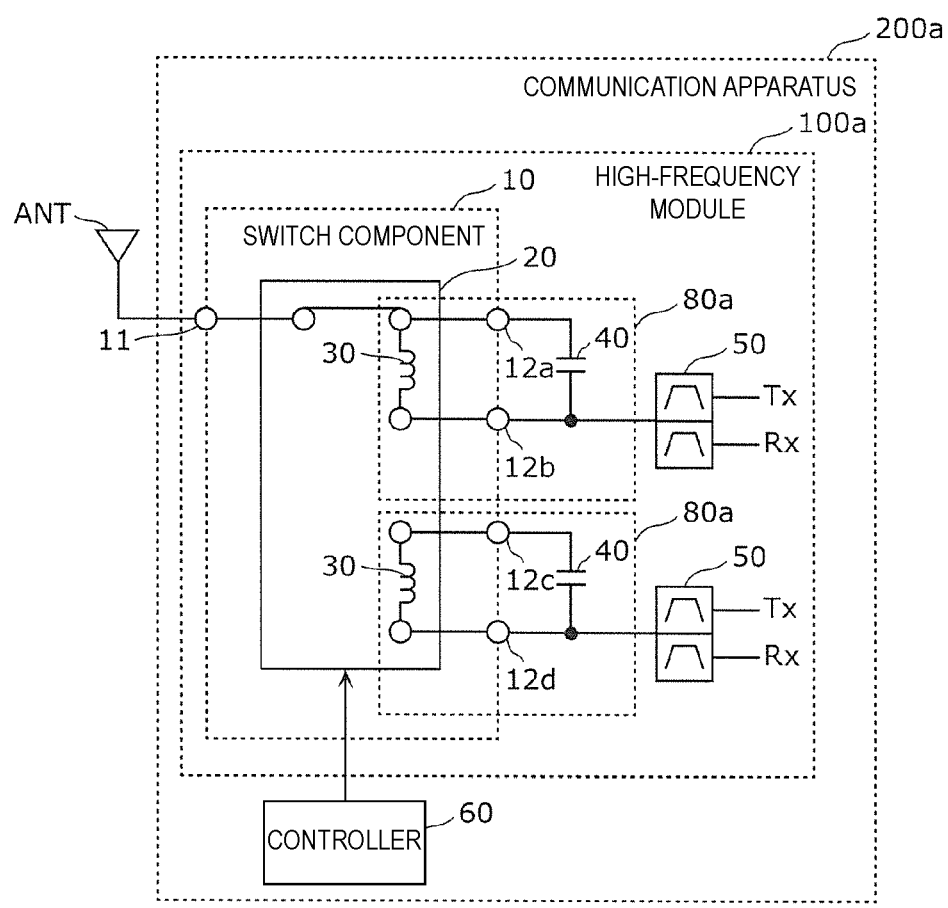
FIG. 3 is a configuration diagram illustrating an example of a communication apparatus according to a second preferred embodiment of the present invention.

FIG. 3 is a configuration diagram illustrating an example of the communication apparatus 200a according to the second preferred embodiment.

The communication apparatus 200a differs from the communication apparatus 200 according to the first preferred embodiment in that the communication apparatus 200a includes a high-frequency module 100a, instead of the high-frequency module 100. In addition, the connection mode of elements around each selection terminal is different from that in the first preferred embodiment. Since the remaining components are the same or substantially the same as those in the first preferred embodiment, a description of such components is omitted herein.

The high-frequency module 100a includes a capacitor 40 connected in parallel to each of the inductors 30 and the inductor 30, and the capacitor 40 defines a parallel resonant circuit 80a, which defines and functions as a band elimination filter. When the common terminal 11 is connected to the selection terminal 12a in a case in which the filter 50 is connected to the selection terminal 12b, it is possible to reduce or prevent, for example, any noise, such as a harmonic component, in the signals propagated on the signal path connecting the antenna element ANT to the filter connected to the selection terminal 12b. Accordingly, integrating the inductor 30 defining the parallel resonant circuit 80a with the switching circuit 20 enables the high-frequency module 100a to be reduced in size.

The connection mode of elements around each selection terminal illustrated in FIG. 3 is only an example. For example, the filter 50 may be connected to the selection terminal 12a. In this case, when the common terminal 11 is connected to the selection terminal 12b, it is possible to reduce or prevent any noise, such as a harmonic component, in the signals propagated on the signal path connecting the antenna element ANT to the filter 50 connected to the selection terminal 12a.

Third Preferred Embodiment

Next, the configuration of a communication apparatus 200b according to a third preferred embodiment of the present invention will now be described with reference to FIG. 4.

Figure 4:
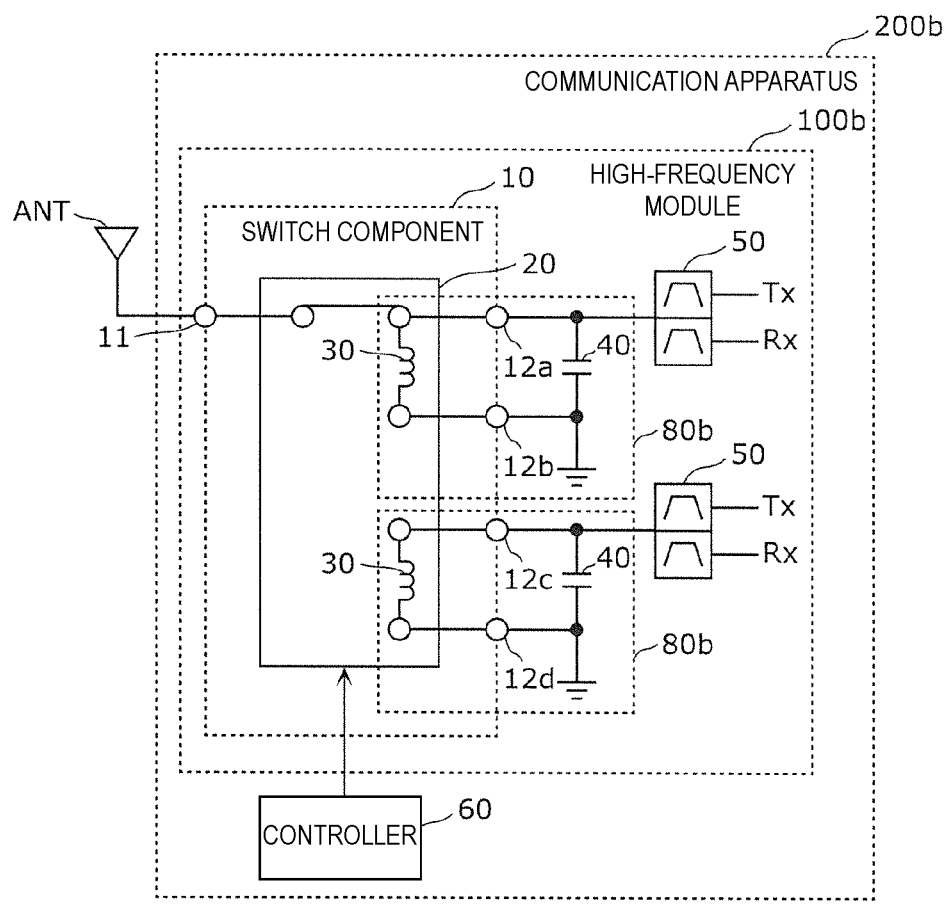
FIG. 4 is a configuration diagram illustrating an example of a communication apparatus according to a third preferred embodiment of the present invention.

FIG. 4 is a configuration diagram illustrating an example of the communication apparatus 200b according to the third preferred embodiment.

The communication apparatus 200b differs from the communication apparatus 200 according to the first preferred embodiment in that the communication apparatus 200b includes a high-frequency module 100b, instead of the high-frequency module 100. In addition, the connection mode of elements around each selection terminal is different from that in the first preferred embodiment. Since the remaining components are the same or substantially the same as those in the first preferred embodiment, a description of such components is omitted herein.

The high-frequency module 100b includes the capacitor 40 connected in parallel to each of the inductors 30. In the high-frequency module 100b, grounding the other end of the inductor 30 (grounding the selection terminal 12b) causes the circuit including the inductor 30 to define and function as a band pass filter 80b. With this configuration, when the common terminal 11 is connected to the selection terminal 12a, it is possible to transmit signals in which any noise, such as a harmonic component, in the signals propagated on the signal path connecting the antenna element ANT to the filter 50 connected to the selection terminal 12a is reduced or prevented and which have desired frequency characteristics. Accordingly, integrating the inductor 30 defining the band pass filter 80b with the switching circuit 20 enables the high-frequency module 100b to be reduced in size.

The connection mode of elements around each selection terminal illustrated in FIG. 4 is only an example. For example, the filter 50 may be connected to the selection terminal 12b and the selection terminal 12a may be grounded. In this case, when the common terminal 11 is connected to the selection terminal 12b, it is possible to transmit signals in which any noise, such as a harmonic component, in the signals propagated on the signal path connecting the antenna element ANT to the filter 50 connected to the selection terminal 12b is reduced or prevented and which have desired frequency characteristics.

Fourth Preferred Embodiment

Next, the configuration of a communication apparatus 200c according to a fourth preferred embodiment of the present invention will now be described with reference to FIG. 5.

Figure 5:
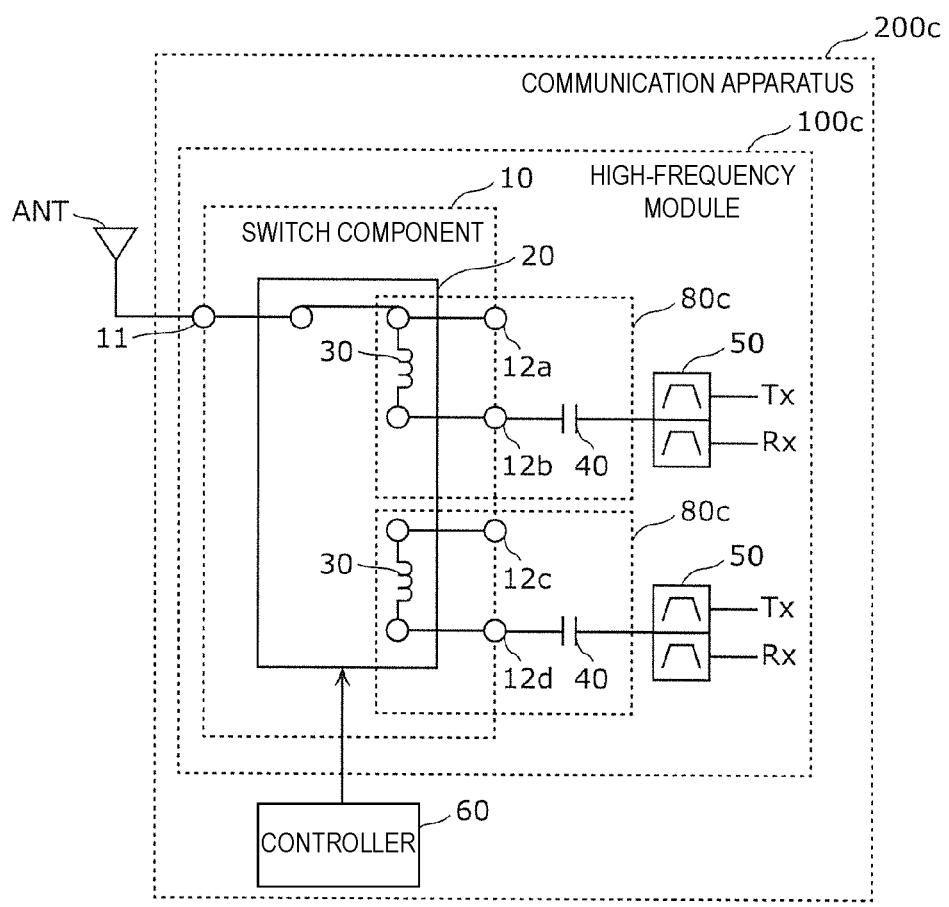
FIG. 5 is a configuration diagram illustrating an example of a communication apparatus according to a fourth preferred embodiment of the present invention.

FIG. 5 is a configuration diagram illustrating an example of the communication apparatus 200c according to the fourth preferred embodiment.

The communication apparatus 200c differs from the communication apparatus 200 according to the first preferred embodiment in that the communication apparatus 200c includes a high-frequency module 100c, instead of the high-frequency module 100. In addition, the connection mode of elements around each selection terminal is different from that in the first preferred embodiment. Since the remaining components are the same or substantially the same as those in the first preferred embodiment, a description of such components is omitted herein.

The high-frequency module 100c includes the capacitor 40. Connecting one end of the capacitor 40 to the other end of the inductor 30 (the selection terminal 12b) causes the inductor 30 and the capacitor 40 to define a series resonant circuit 80c, which defines and functions as a band pass filter. The filter 50 is connected to the other end of the capacitor 40. When the common terminal 11 is connected to the selection terminal 12a, it is possible to transmit signals in which any noise, such as a harmonic component, in the signals propagated on the signal path connecting the antenna element ANT to the filter 50 connected to the selection terminal 12b via the capacitor 40 is reduced or prevented and which have desired frequency characteristics. In addition, it is possible to reduce or prevent, for example, any noise, such as a harmonic component, which is superposed on the signals and which is caused by the switch component 10. Accordingly, integrating the inductor 30 defining the series resonant circuit 80c with the switching circuit 20 enables the high-frequency module 100c to be reduced in size.

The connection mode of elements around each selection terminal illustrated in FIG. 5 is only an example. For example, one end of the capacitor 40 may be connected to one end of the inductor 30 (the selection terminal 12a), and the filter 50 may be connected to the other end of the capacitor 40. In this case, when the common terminal 11 is connected to the selection terminal 12b, it is possible to transmit signals in which any noise, such as a harmonic component, in the signals propagated on the signal path connecting the antenna element ANT to the filter 50 connected to the selection terminal 12a via the capacitor 40 is reduced or prevented and which have desired frequency characteristics.

Fifth Preferred Embodiment

Next, the configuration of a communication apparatus 200d according to a fifth preferred embodiment of the present invention will now be described with reference to FIG. 6.

Figure 6:
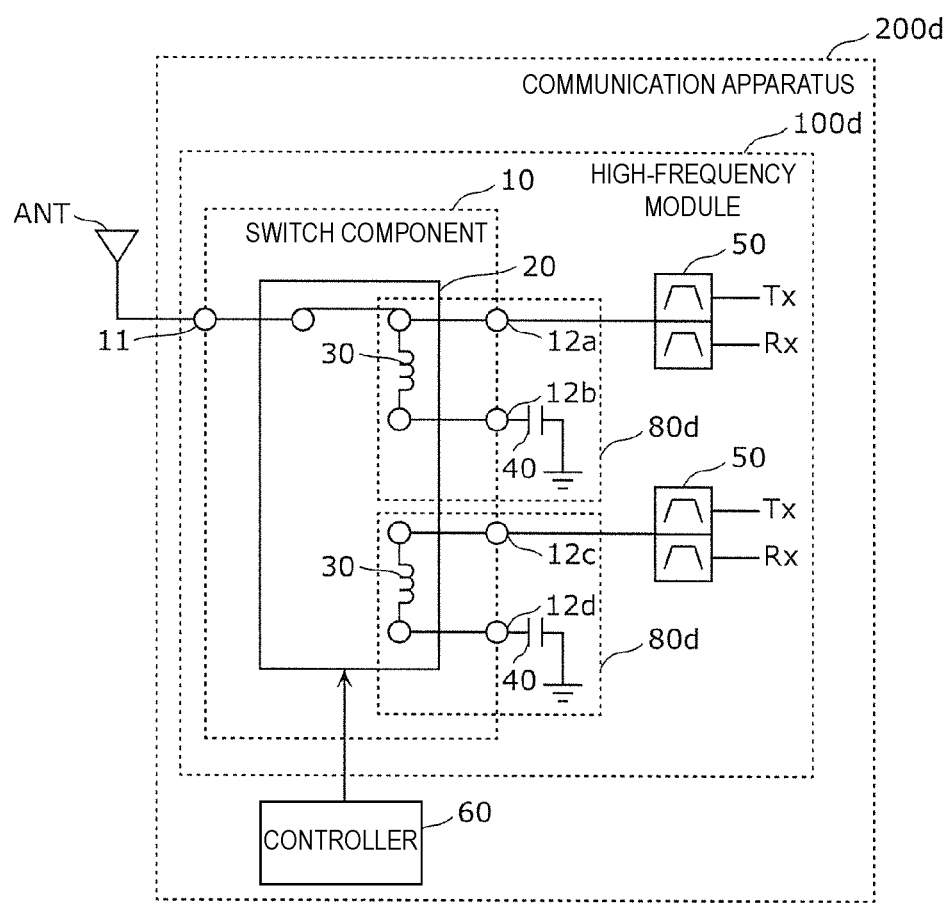
FIG. 6 is a configuration diagram illustrating an example of a communication apparatus according to a fifth preferred embodiment of the present invention.

FIG. 6 is a configuration diagram illustrating an example of the communication apparatus 200d according to the fifth preferred embodiment.

The communication apparatus 200d differs from the communication apparatus 200 according to the first preferred embodiment in that the communication apparatus 200d includes a high-frequency module 100d, instead of the high-frequency module 100. In addition, the connection mode of elements around each selection terminal is different from that in the first preferred embodiment. Since the remaining components are the same or substantially the same as those in the first preferred embodiment, a description of such components is omitted herein.

The high-frequency module 100d includes the capacitor 40. One end of the capacitor 40 is connected to the other end of the inductor 30 (the selection terminal 12b). Grounding the other end of the capacitor 40 causes the circuit including the inductor 30 to define and function as a band elimination filter 80d. When the common terminal 11 is connected to the selection terminal 12a, it is possible to reduce or prevent any noise, such as a harmonic component, in the signals propagated on the signal path connecting the antenna element ANT to the filter 50 connected to the selection terminal 12a. Accordingly, integrating the inductor 30 defining the band elimination filter 80d with the switching circuit 20 enables the high-frequency module 100d to be reduced in size.

The connection mode of elements around each selection terminal illustrated in FIG. 6 is only an example. For example, one end of the capacitor 40 may be connected to one end of the inductor 30 (the selection terminal 12a) and the other end of the capacitor 40 may be grounded. In this case, when the common terminal 11 is connected to the selection terminal 12b, it is possible to reduce or prevent any noise, such as a harmonic component, in the signals propagated on the signal path connecting the antenna element ANT to the filter 50 connected to the selection terminal 12b.

Sixth Preferred Embodiment

Next, the configuration of a communication apparatus 200e according to a sixth preferred embodiment of the present invention will now be described with reference to FIG. 7.

Figure 7:
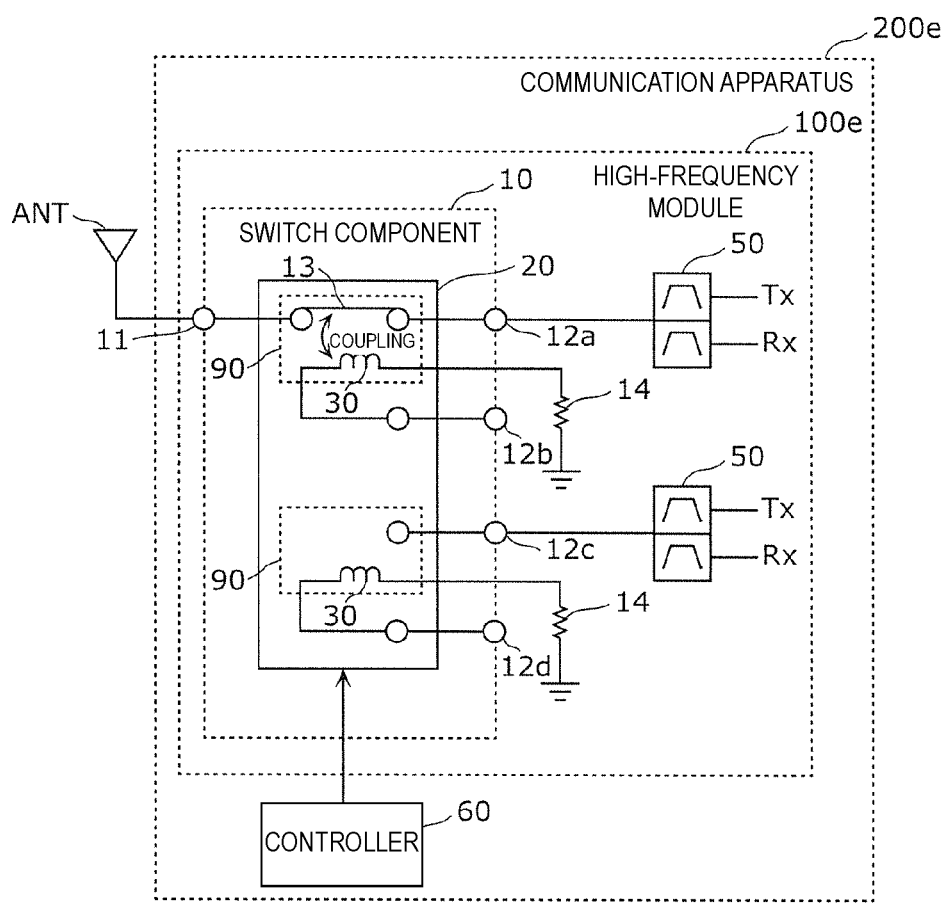
FIG. 7 is a configuration diagram illustrating an example of a communication apparatus according to a sixth preferred embodiment of the present invention.

FIG. 7 is a configuration diagram illustrating an example of the communication apparatus 200e according to the sixth preferred embodiment.

The communication apparatus 200e differs from the communication apparatus 200 according to the first preferred embodiment in that the communication apparatus 200e includes a high-frequency module 100e, instead of the high-frequency module 100. The inductor 30 is coupled to a signal path 13 between the common terminal 11 connected with the switching circuit 20 and one selection terminal (for example, the selection terminal 12a), among the at least two selection terminals. For example, the inductor 30 is provided near the signal path 13 in the switching circuit 20. Accordingly, the circuit including the inductor 30 defines and functions as a coupler 90. In addition, the connection mode of elements around each selection terminal is different from that in the first preferred embodiment. Since the remaining components are the same or substantially the same as those in the first preferred embodiment, a description of such components is omitted herein.

In the high-frequency module 100e, one end of the inductor 30 is connected to, for example, the selection terminal 12b. The other end of the inductor 30 is grounded via, for example, a resistor 14 (for example, about 50Ω). With this configuration, monitoring the voltage at the selection terminal 12b enables the strengths of the signals propagated on the signal path 13 to be measured. Accordingly, integrating the inductor 30 defining the coupler 90 capable of measuring the strengths of the signals with the switching circuit 20 enables the high-frequency module 100e to be reduced in size.

The connection mode of elements around each selection terminal illustrated in FIG. 7 is only an example. For example, the inductor 30 may be connected to a signal path between the common terminal 11 connected with the switching circuit 20 and the selection terminal 12b. One end of the inductor 30 may be connected to the selection terminal 12a and the other end thereof may be grounded via the resistor 14. Accordingly, monitoring the voltage at the selection terminal 12a enables the strengths of the signals propagated on the signal path to be measured.

Although the switch components, the high-frequency modules, and the communication apparatuses according to the preferred embodiments are described above, the present invention is not limited to the above-described preferred embodiments.

For example, although the controller 60 is provided in the communication apparatus in the above-described preferred embodiments, the controller 60 is not limited to this. For example, the switch component 10 may include the controller 60. In other words, the switch component 10 (the switching circuit 20) may selectively connect the common terminal 11 to each of the at least two selection terminals with the controller 60 included in the switch component 10 (the switching circuit 20) without receiving the control signal that is externally supplied.

In addition, for example, although the filter 50 is a duplexer in the above-described preferred embodiments, the filter 50 is not limited to this. For example, the filter 50 may be a low pass filter, a high pass filter, a band elimination filter, or other suitable filter.

Furthermore, for example, although the inductor 30 is built in the switching circuit 20 in the switch component 10 in the above-described preferred embodiments, the inductor 30 is not limited to this. For example, the inductor 30 may not be built in the switching circuit 20. This will now be described with reference to FIGS. 8A and 8B.

Figure 8A:
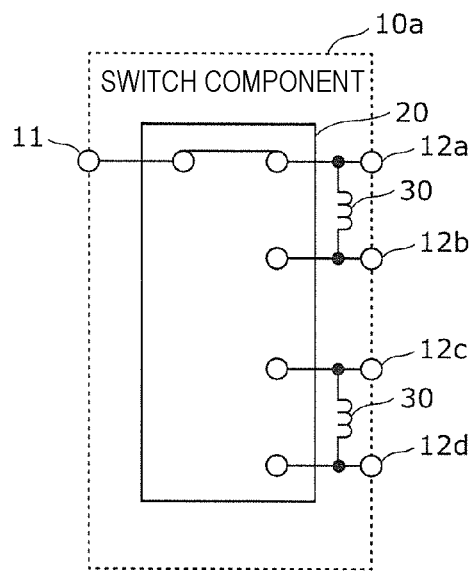
FIG. 8A is a configuration diagram illustrating an example a switch component according to another preferred embodiment of the present invention.

FIG. 8A is a configuration diagram illustrating an example a switch component 10a according to another preferred embodiment of the present invention.

Figure 8B:
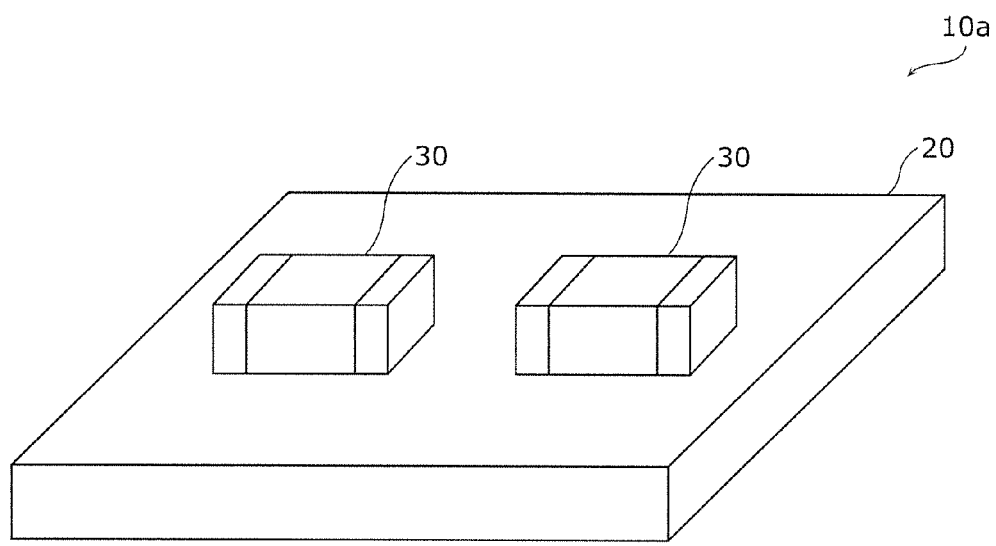
FIG. 8B is an external schematic view illustrating an example of the switch component according to the other preferred embodiment of the present invention.

FIG. 8B is an external schematic view illustrating an example of the switch component 10a according to the another preferred embodiment. A leading conductor of the inductor 30, the common terminal 11, and the selection terminals 12a to 12d are not illustrated in FIG. 8B.

As illustrated in FIG. 8B, the inductors 30 may be disposed on the switching circuit 20 (for example, a semiconductor substrate). The switching circuit 20 is integrated with the inductors 30 with a resin mold or other suitable material. The switching circuit 20 and the inductors 30, which are integrated with each other in the above-described manner, define the switch component 10a. In other words, the switch component 10 is the switching circuit 20 itself including the inductors 30 in the above-described preferred embodiments while the switch component 10a is defined by integrating the switching circuit 20 with the inductors 30 disposed on the switching circuit 20 with the resin mold or other suitable material. FIG. 8A does not indicate that the inductors 30 are provided separately from the switching circuit 20, but indicate that the inductors 30 are not built in the switching circuit 20 but are disposed on the switching circuit 20. In addition, although the inductors 30 are indicated as chip inductors in FIG. 8B, the inductors 30 may be patterns that are, for example, printed on the switching circuit 20.

In addition, the controller 60 may be defined by an integrated circuit (IC) or a large scale integration (LSI) circuit. The integrated circuit technique may be achieved with a dedicated circuit or a general-purpose processor. After manufacturing the LSI circuit, a field programmable gate array (FPGA) that is capable of being programmed or a reconfigurable processor that is capable of reconfiguring connection or setting of circuit cells in the LSI circuit may be used. Furthermore, if an integrated circuit technology with which the LSI circuit is replaced as a result of advancements in the semiconductor technology or another derivative technology, the integration of functional blocks may be performed using the technology.

Furthermore, in the switch components, the high-frequency modules, and the communication apparatuses according to the above-described preferred embodiments, other elements, wiring, and components may be provided between the respective elements and the respective terminals (for example, the common terminal and the selection terminals) disclosed in the drawings.

Configurations achieved by making various modifications conceived by the persons skilled in the art to the preferred embodiments and configurations achieved through arbitrary combination of the components and the functions in the respective preferred embodiments within the scope and sprit of the present invention are also included in the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A switch component comprising:
a common terminal;
at least two selection terminals;
a switching circuit that selectively connects the common terminal to each of the at least two selection terminals; and
an inductor; wherein
a first end of the inductor is connected to one of the at least two selection terminals; and
the switching circuit is integrated with the inductor, and includes a switch including a diode or a transistor.

2. The switch component according to claim 1, wherein the inductor is built in the switching circuit.

3. The switch component according to claim 1, wherein a second end of the inductor is connected to a selection terminal different from the one of the at least two selection terminals.

4. The switch component according to claim 1, wherein a second end of the inductor is grounded.

5. The switch component according to claim 1, wherein a capacitor is connected in parallel to the inductor.

6. The switch component according to claim 1, wherein a first end of a capacitor is connected to a second end of the inductor.

7. The switch component according to claim 6, wherein a second end of the capacitor is grounded.

8. The switch component according to claim 1, wherein the inductor is coupled to a signal path between the common terminal connected with the switching circuit and one of the at least two selection terminals.

9. A high-frequency module comprising:
the switch component according to claim 1; and
a filter connected to at least one of the at least two selection terminals.

10. The high-frequency module according to claim 9, wherein the inductor is built in the switching circuit.

11. The high-frequency module according to claim 9, wherein a second end of the inductor is connected to a selection terminal different from the one of the at least two selection terminals.

12. The high-frequency module according to claim 9, wherein a second end of the inductor is grounded.

13. The high-frequency module according to claim 9, wherein a capacitor is connected in parallel to the inductor.

14. The high-frequency module according to claim 9, wherein a first end of a capacitor is connected to a second end of the inductor.

15. The high-frequency module according to claim 14, wherein a second end of the capacitor is grounded.

16. The high-frequency module according to claim 9, wherein the inductor is coupled to a signal path between the common terminal connected with the switching circuit and one of the at least two selection terminals.

17. A communication apparatus comprising:
the high-frequency module according to claim 9; and
a controller that controls the switching circuit.

18. The communication apparatus according to claim 17, wherein a second end of the inductor is connected to a selection terminal different from the one of the at least two selection terminals.

19. The communication apparatus according to claim 17, wherein a second end of the inductor is grounded.

20. The communication apparatus according to claim 17, wherein a capacitor is connected in parallel to the inductor.

* * * * *